US005790436A

United States Patent [19]
Chen et al.

[11] Patent Number: 5,790,436
[45] Date of Patent: Aug. 4, 1998

[54] REALISTIC WORST-CASE CIRCUIT SIMULATION SYSTEM AND METHOD

[75] Inventors: James Chieh-Tsung Chen, Foster City; Zhihong Liu, Sunnyvale; Chenming Hu, Alamo; Ping Keung Ko, Richmond, all of Calif.

[73] Assignee: BTA Technology, Inc., Santa Clara, Calif.

[21] Appl. No.: 963,510

[22] Filed: Nov. 3, 1997

Related U.S. Application Data

[63] Continuation of Ser. No. 431,337, Apr. 28, 1995, abandoned.
[51] Int. Cl.[6] .................................................. G06F 17/00
[52] U.S. Cl. ................................. 364/578; 364/490
[58] Field of Search ............................. 364/578, 488, 364/489, 490, 491

[56] References Cited

U.S. PATENT DOCUMENTS

| 5,406,497 | 4/1995 | Altheimer et al. ................ 364/489 |
| 5,548,539 | 8/1996 | Vlach et al. .................... 364/578 |

OTHER PUBLICATIONS

P. Touhy et al., "Realistic Worst–Case Parameters for Circuit Simulation", IEE Proceedings, vol. 134, Pt.I, No. 5, Oct. 1987, pp. 137–140.
Nassif, S.R., et al., "A Methodology for Worst–Case Analysis of Integrated Circuits", IEEE Transactions on Computer aided design, vol. CAD–5, No. 1, 104–113 (1986).
Cox, P., et al. "Statistical Modeling for Efficient Parametric Yield Estimation of MOS VLSI Circuits", IEEE Trans. Electron Devices, vol. ED–32 No. 2, 471–478 (1985).
Bolt, M., et al., "Realistic Statistical Worst–Case Simulations of VLSI Circuits", IEEE Transactions on Semiconductor Manufacturing, vol. 4 No. 3, 193–198 (1991).

Primary Examiner—Kevin J. Teska
Assistant Examiner—A. S. Roberts
Attorney, Agent, or Firm—Stephen M. Knauer; Flehr Hohbach Test Albritton & Herbert LLP

[57] ABSTRACT

A system and method of simulating operation of an integrated circuit. First, circuit characteristics of circuit components are measured, and a set of circuit simulation model parameters are generated for each measured circuit component. Then, the operation of predefined circuit primitives is simulated using each of the generated sets of circuit simulation model parameters. The circuit primitives include the measured circuit components. The simulated operations are then analyzed to select ones of the simulated operations that are worst, best and nominal with respect to a specified circuit performance parameter and to extract model parameters corresponding to the worst case, best case and nominal case sets of circuit simulation model parameters from the generated sets of circuit simulation model parameters. Each extracted set of circuit simulation model parameters comprises one of the generated sets of circuit simulation model parameters. Then a target circuit is simulated using each of the worst case, best case and nominal case sets of circuit simulation model parameters so as to generate data representing the target circuits under worst case, best case and nominal case manufacturing conditions.

20 Claims, 8 Drawing Sheets

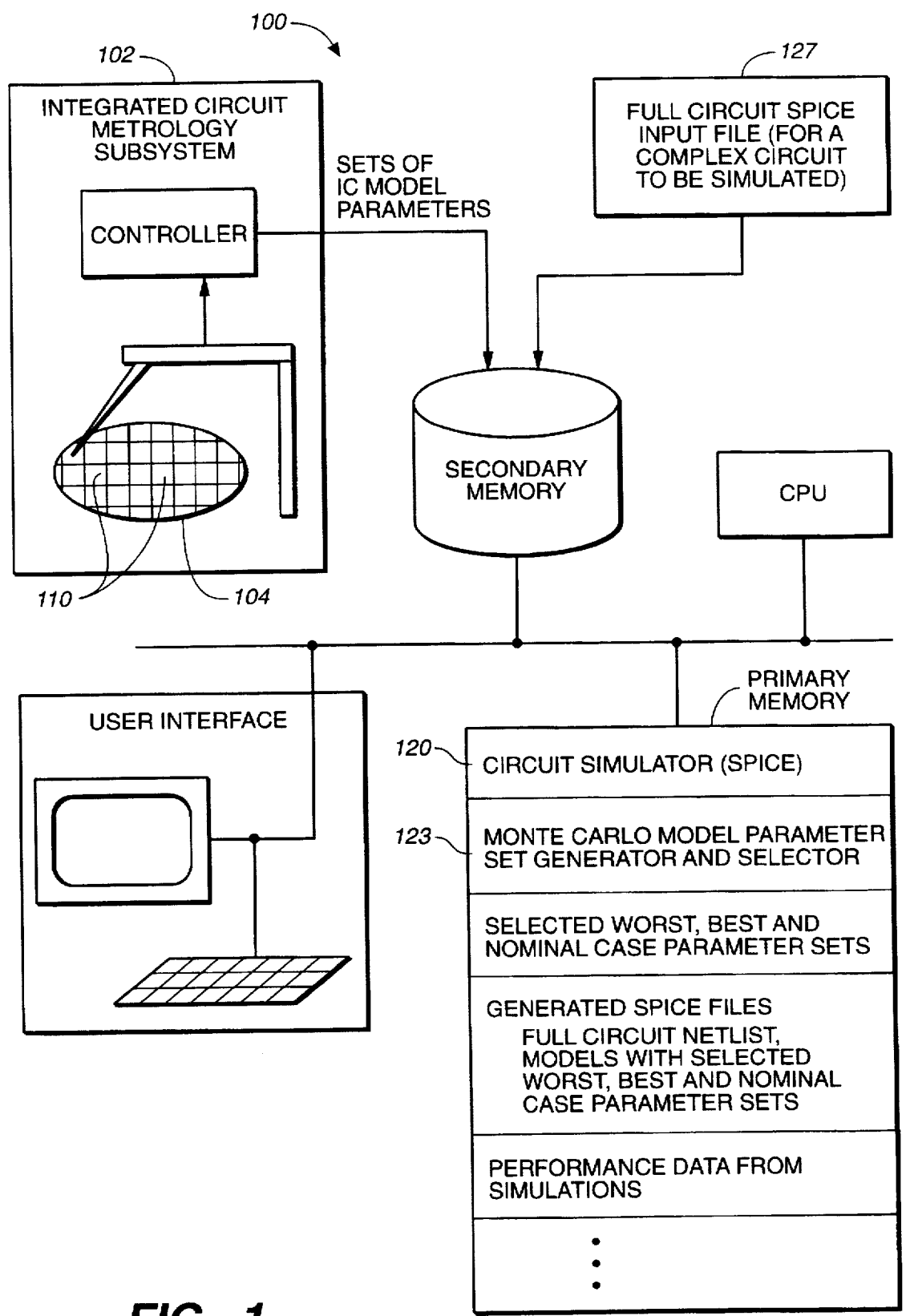
FIG._1

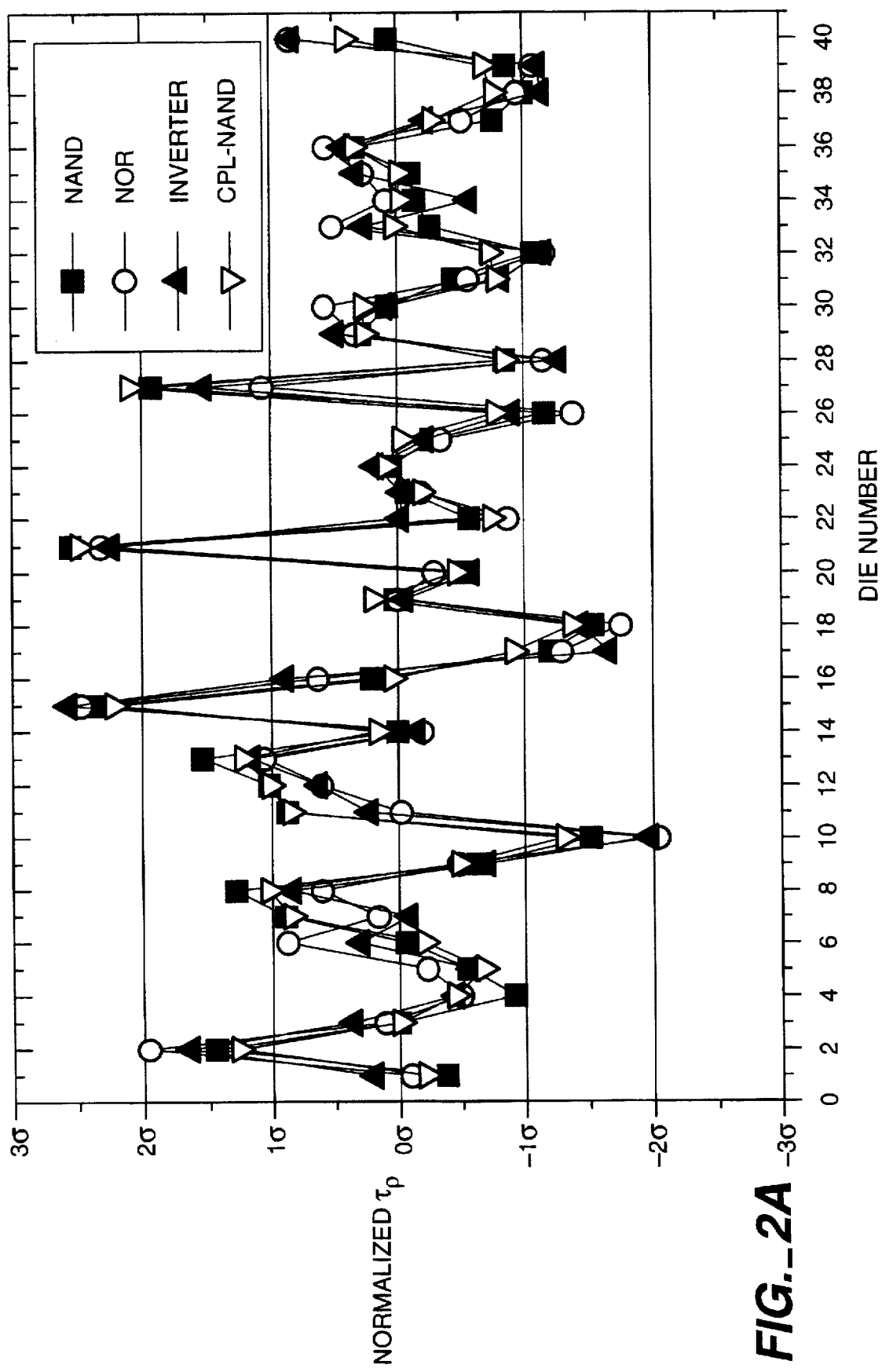
FIG._2A

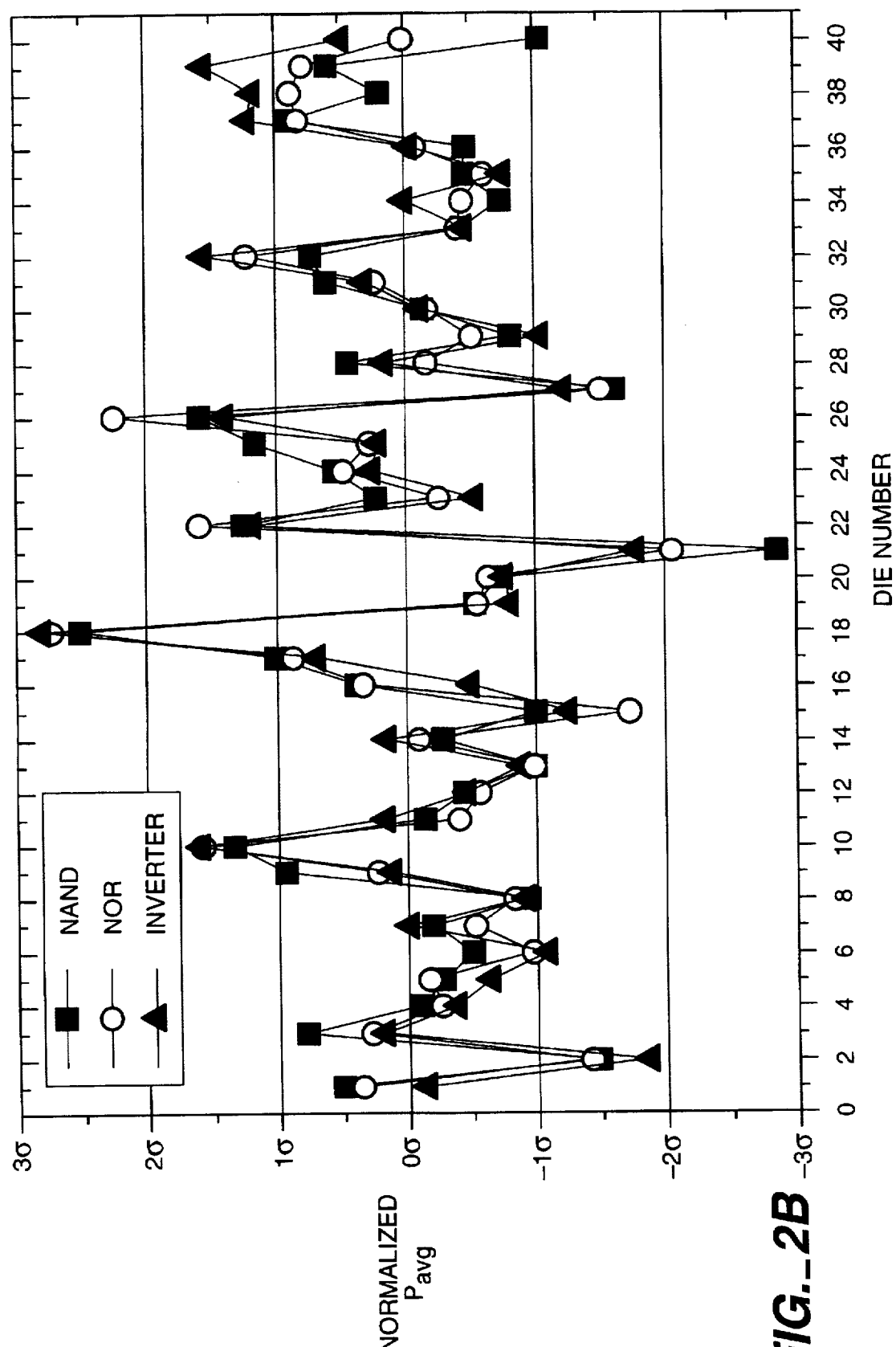
FIG._2B

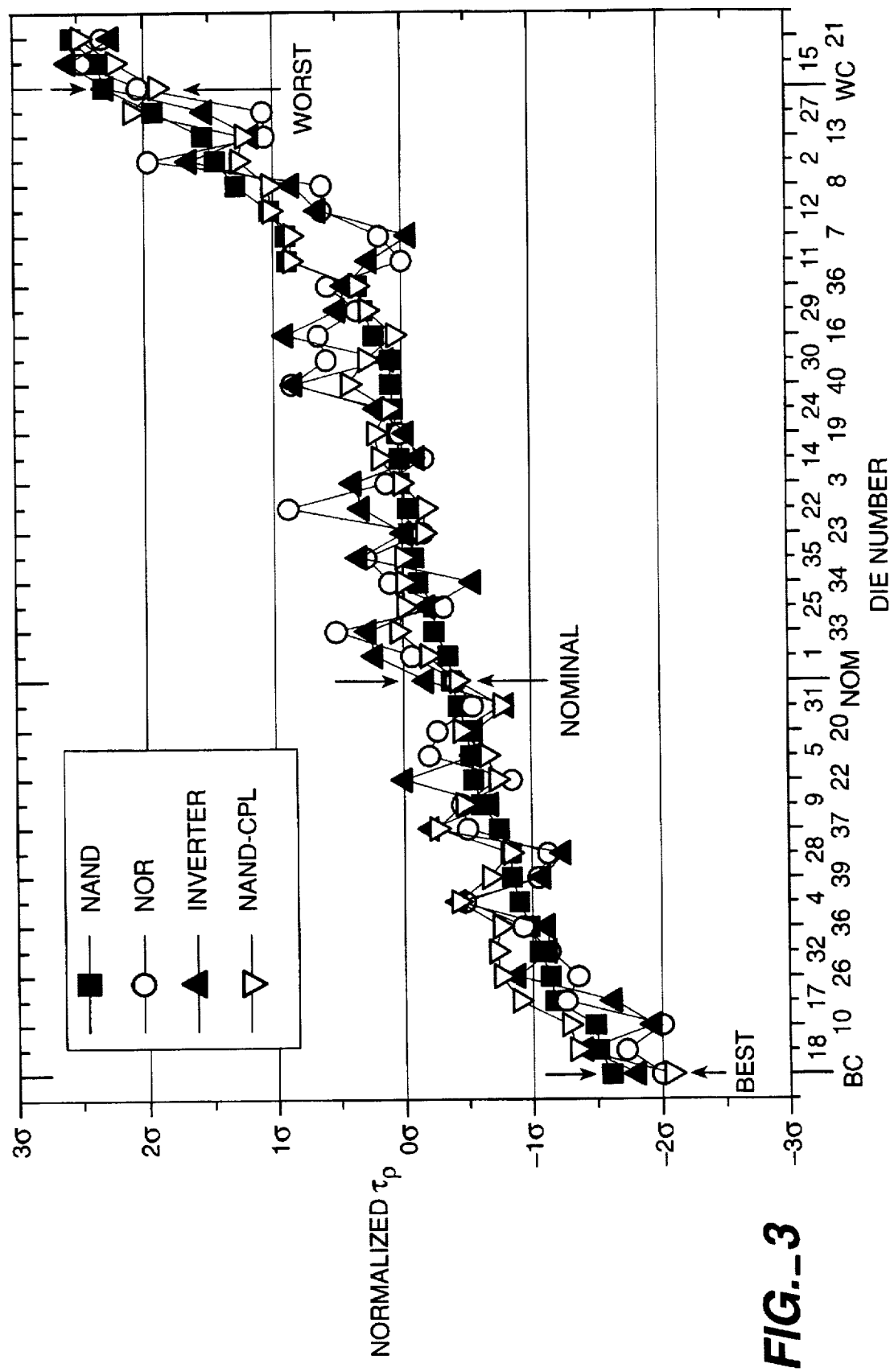
FIG._3

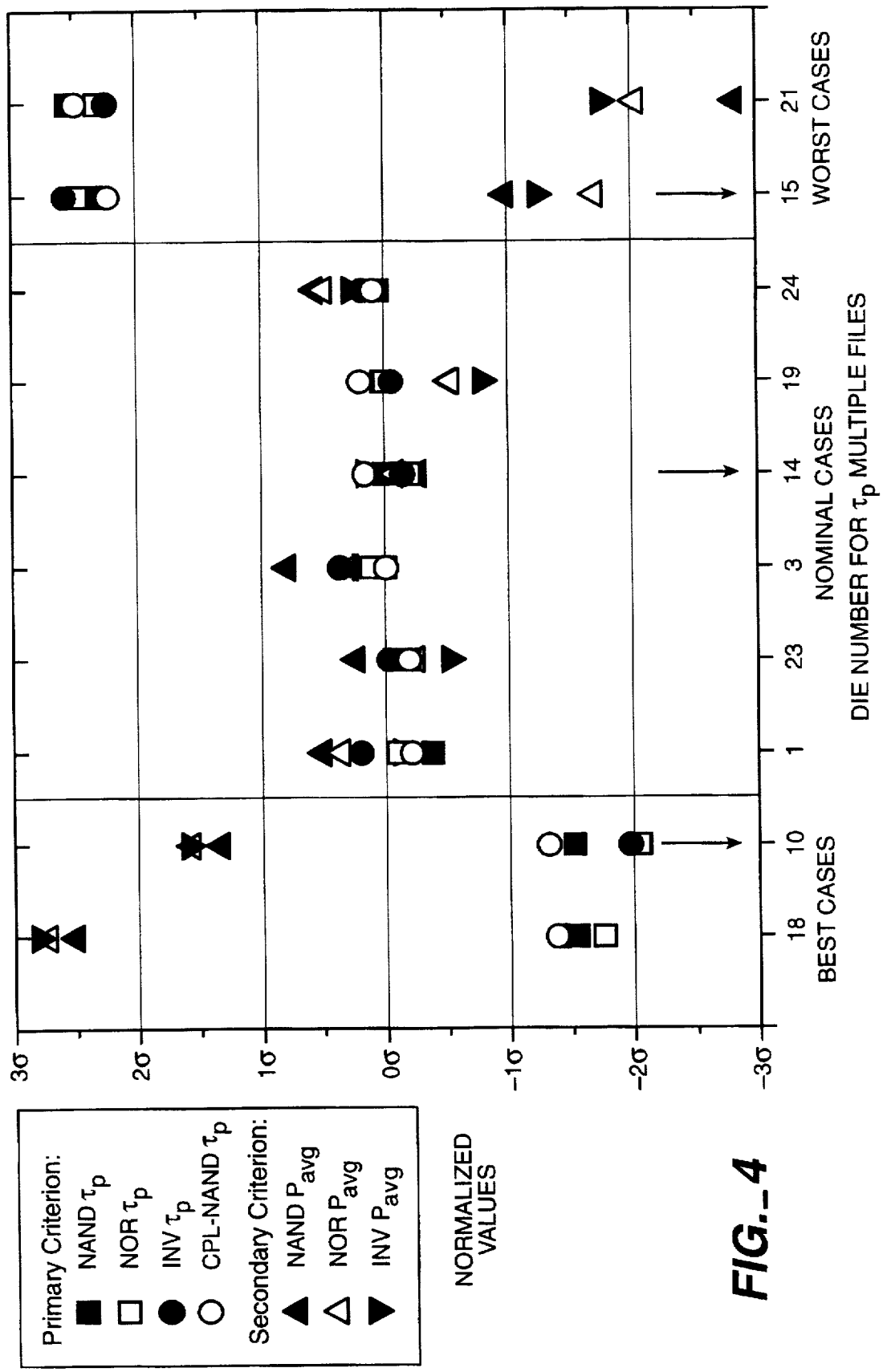
FIG._4

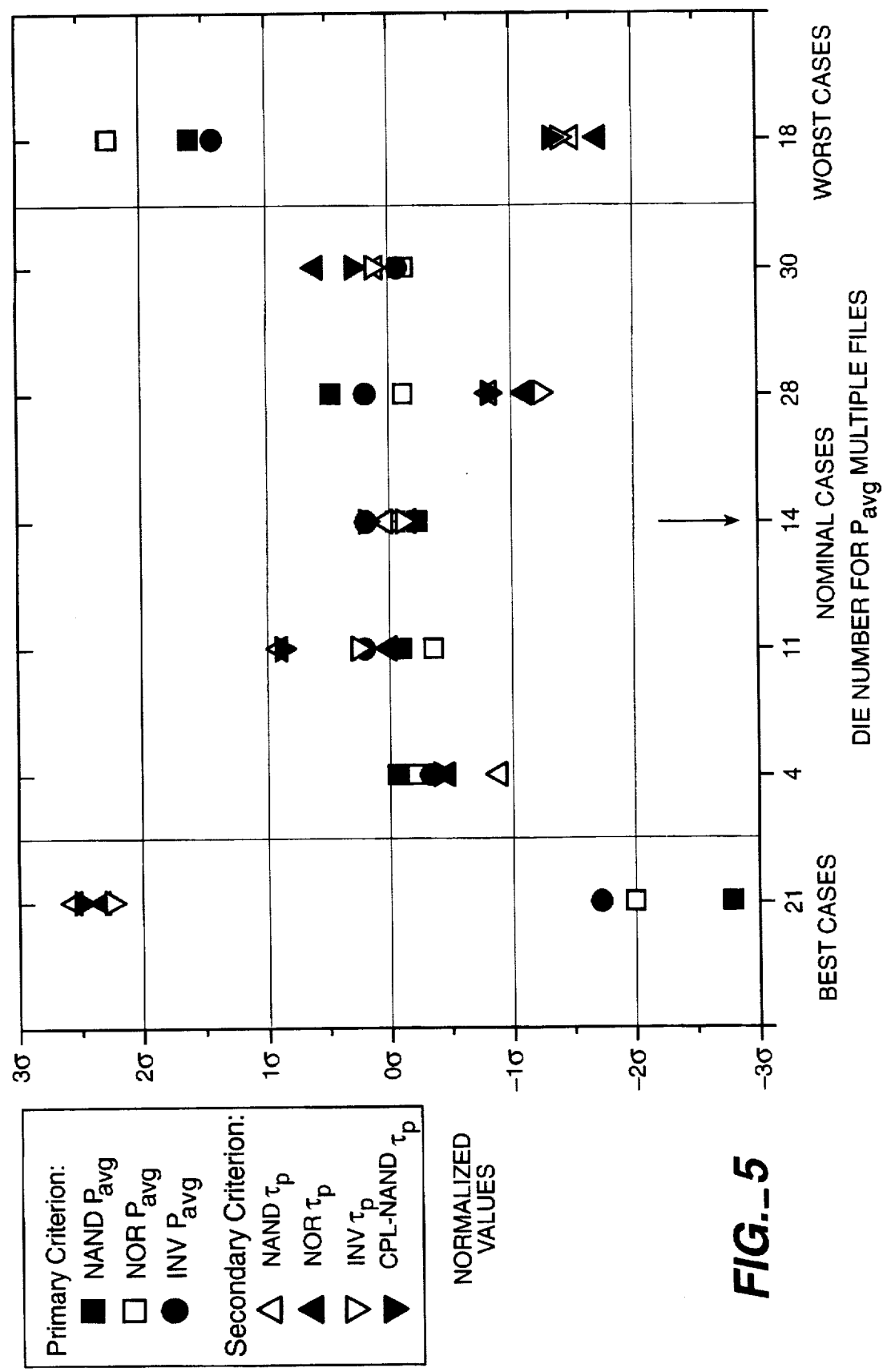
FIG._5

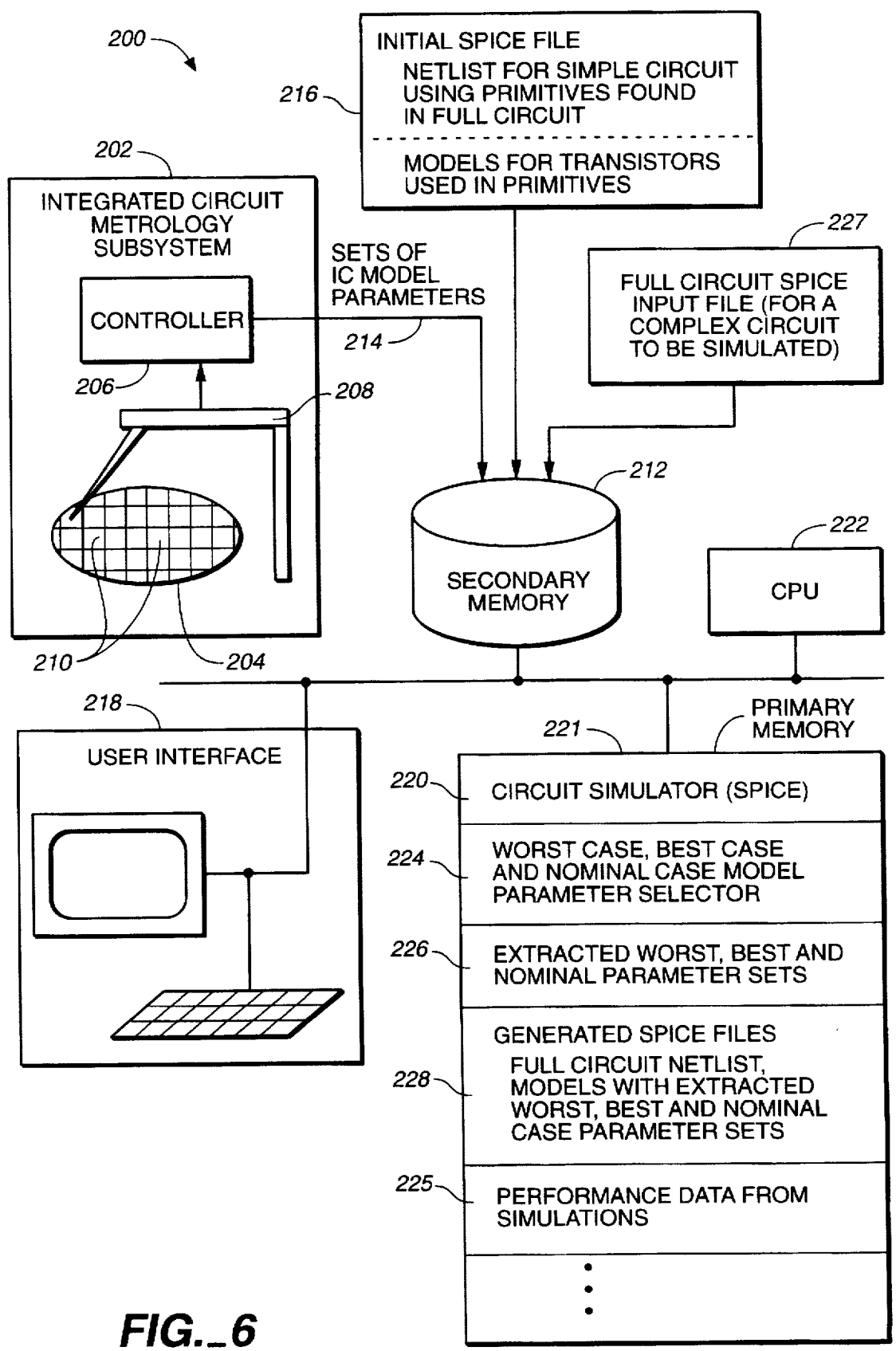
FIG._6

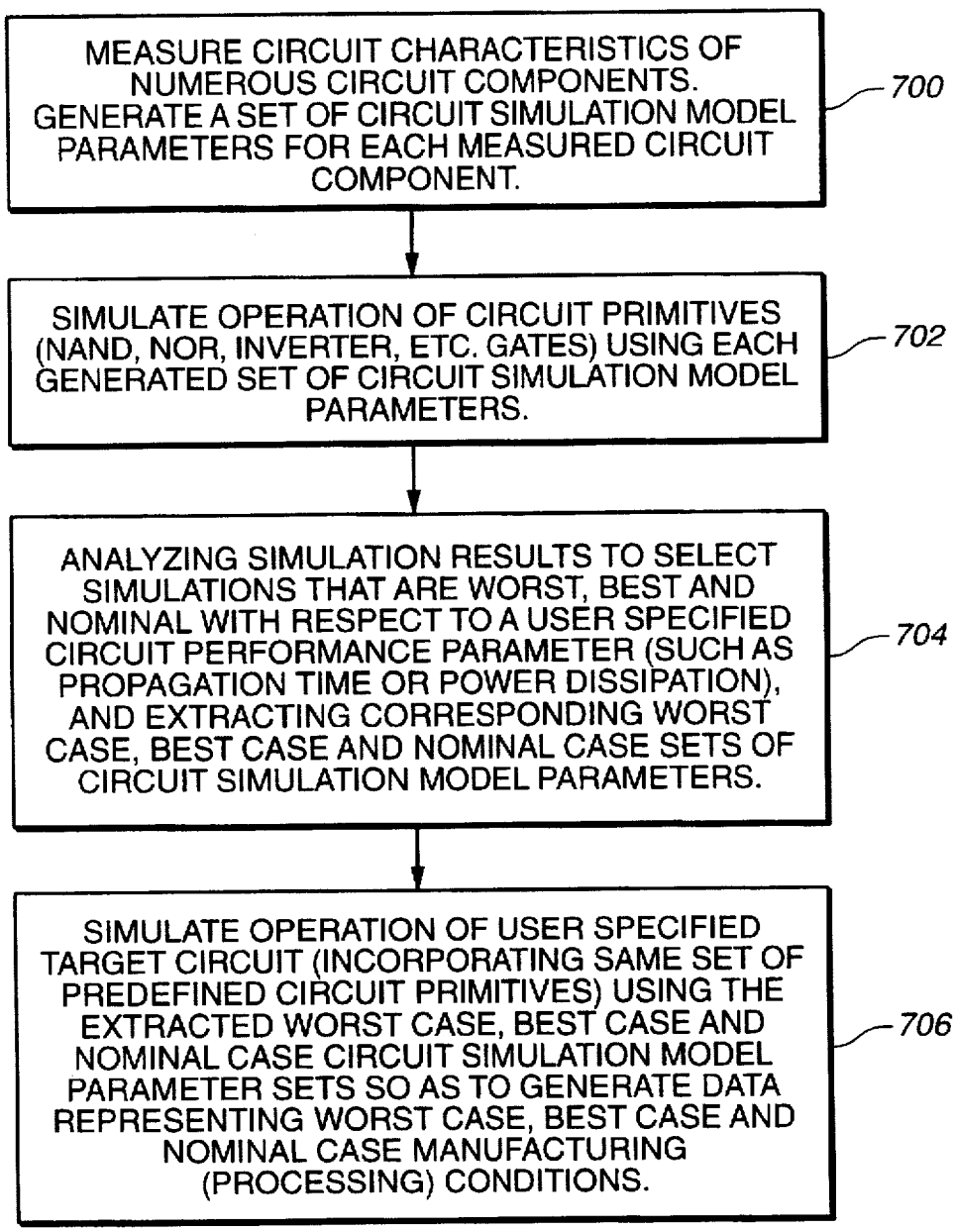
FIG._7

REALISTIC WORST-CASE CIRCUIT SIMULATION SYSTEM AND METHOD

This is a continuation of application Ser. No. 08/431,337 filed Apr. 28, 1995, now abandoned.

The present invention relates generally to the use of circuit simulators to predict circuit performance, and particularly to a system and method for generating input files for a circuit simulator so as to simulate operation of a circuit under a set of worst case conditions.

BACKGROUND OF THE INVENTION

SPICE is a well established circuit simulation program. Referring to FIG. 1, a SPICE circuit simulator 120 is typically configured to include a number of circuit component models, some of which are quite complex and include many parameters. The appropriate parameter settings for a model for a particular circuit element, such as a MOS transistor, a CMOS inverter or a logic gate, are typically determined by measurement, with an integrated circuit (IC) metrology subsystem 102, of numerous physical parameters of circuit components at different dies 110 of an IC wafer 104.

When simulating the operation of a particular circuit using the SPICE simulation program, a SPICE input file 127 is provided by the user that describes the circuit to be simulated and the conditions under which the simulation is to be performed. In particular, the SPICE input file contains a netlist listing the circuit components in the circuit to be simulated, interconnections between those components, the circuit model to be used for simulating operation of each circuit component, and circuit model parameters for those circuit models.

The challenge of providing accurate SPICE files representative of process fluctuations has spawned many methodologies. The most common of these deal with selectively manipulating certain physical device parameters with a Monte Carlo simulator 123 to predict circuit performance distributions. A publication concerning use of this methodology is Paul Cox et al, "Statistical Modeling for Efficient Parameter Yield Estimation of MOS VLSI Circuits," IEEE Trans. Electron Devices, vol. ED-32, no. 2, pp. 471–478, February 1985.

Despite the popularity of this methodology, there are several problems. First, the interdependencies between physical device parameters are never zero. Treating them as such introduces unrealistic decoupling. Second, simulations using worst-case files generated through Monte Carlo simulations are slow, even for simple circuits such as the ring oscillator. This has led to the introduction of abbreviated "Monte Carlo" simulations or process "corner" simulations. Here, the worst-case file for a circuit performance parameter at the 3-sigma level is generated amongst combinations of device parameters at their respective 3-sigma values. The validity of this assumption is not reasonable. Various combinations of device parameters can be shown to produce identical performance values.

The issue of identical or very similar performance values produced from Monte Carlo simulations is an additional problem. Since the result of each simulation is a set of device parameters, more than one unique set can exist which give the same simulated performance.

Traditionally, the problem of resolving multiple files is done by averaging device parameter values. This introduces an artificial device parameter set and results in unrealistic performance predictions as well.

SUMMARY OF THE INVENTION

In summary, the present invention is a system and method of simulating operation of an integrated circuit. First, circuit characteristics of circuit components are measured, and a set of circuit simulation model parameters are generated for each measured circuit component. Then, the operation of predefined circuit primitives is simulated using each of the generated sets of circuit simulation model parameters. The circuit primitives include the measured circuit components. The simulated operations are then analyzed to select ones of the simulated operations that are worst, best and nominal with respect to a specified circuit performance parameter and to extract model parameters corresponding to the worst case, best case and nominal case sets of circuit simulation model parameters from the generated sets of circuit simulation model parameters. Each extracted set of circuit simulation model parameters comprises one of the generated sets of circuit simulation model parameters. Then a target circuit is simulated using each of the worst case, best case and nominal case sets of circuit simulation model parameters so as to generate data representing the target circuits under worst case, best case and nominal case manufacturing conditions.

BRIEF DESCRIPTION OF THE DRAWINGS

Additional objects and features of the invention will be more readily apparent from the following detailed description and appended claims when taken in conjunction with the drawings, in which:

FIG. 1 is a block diagram of a computer system utilizing a circuit simulator.

FIG. 2A shows propagation delay measurement data for multiple instances of four circuit elements. FIG. 2B shows power dissipation measurement data for multiple instances of four circuit elements.

FIG. 3 shows propagation delay values generated from circuit simulations using averaged parameter sets (indicated by arrows) for worst and nominal case $t_p$.

FIG. 4 shows propagation delay values generated from circuit simulations using multiple files generated using the present invention.

FIG. 5 shows power dissipation values generated from circuit simulations using multiple files generated using the present invention.

FIG. 6 is a block diagram of a system utilizing a circuit simulator in accordance with the present invention.

FIG. 7 shows the steps of the methodology of the present invention.

DESCRIPTION OF THE PREFERRED EMBODIMENT

Referring to FIG. 6, there is shown a system 200 for generating (or extracting) realistic circuit simulation files and for running circuit simulations using the generated files.

The system 200 includes an integrated circuit (IC) metrology subsystem 202. The metrology subsystem 202 may be of the type conventionally used in process fabrication to make routine parameter (or characteristic) measurements of an IC wafer 204.

Specifically, the metrology subsystem 202 includes a measurement controller 206 to make device parameter measurements with a probe assembly 208 for predetermined circuit components at each of a predetermined number of dies 210 of the wafer 204. The set (or file) of measurements for each sampled die will vary from die to die because of fabrication process fluctuations. The controller 206 places the set of parameter measurements 214 for each sampled die 210 into the secondary memory 212 in tabular form.

The parameter measurements are of the type routinely collected by integrated circuit fabrication facilities for process control. Thus, the invention described herein does not introduce new metrology but rather suggests additional uses for existing metrology.

In the preferred embodiment, BSIMPro, a Windows driven extractor, is run by the controller 206 to control the extraction and making of BSIM model parameters for CMOS and PMOS transistor circuit components. See J. H. Huang et al, BSIM3 Manual Version 2.0, UC Berkeley, 1994, which is hereby incorporated by reference. The BSIM model parameters include oxide thickness (Tox), threshold voltage (Vth), effective length shortening of gate (dl), effective width shortening of gate (dw), first order body effect parameter (K1), second order body effect parameter (K2), and source/drain parasitic resistance (Rds0).

The predetermined circuit components for which parameters are measured may be used to form predefined circuit primitives (i.e., building blocks) of more complex circuits. For example, NMOS and PMOS transistors may be used to form circuit primitives, such as NOR, NAND, inverter, and NAND CPL gates, which are used in more complex digital circuits. As will become evident from the following discussion, the parameter measurements made by the metrology subsystem 202 can be used to generate realistic best, worst, and nominal case circuit simulation model parameter sets or files for the measured circuit components that make up the circuit primitives based on simulations of these primitives.

In order to produce the best, worst, and nominal case circuit simulation files, an initial circuit simulation file 216 is generated for each primitive. The initial circuit simulation file 216 for each primitive contains a netlist for the circuit components of the type for which the parameters were measured and which make up the circuit primitive. Moreover, each initial circuit simulation file 216 includes models for these circuit components. The initial circuit simulation files 216 may be generated with the user interface 218 and stored in the secondary memory 212.

With the user interface 218, a user then runs a circuit simulation for each circuit primitive with the circuit simulator 220, the initial circuit simulation file 216 for that circuit primitive, and each set of measured parameters 214 for circuit components that comprise the circuit primitive (block 702 of FIG. 7). The circuit simulator 220 is stored in the primary memory 221 and run on the CPU 222. In the preferred embodiment, the circuit simulator 220 is a SPICE circuit simulator.

The circuit simulator 220 simulates the performance of each primitive for each set of measured parameters 214 and generates performance data for each set of measured parameters 214. The performance data 225 is stored in the primary memory 221 and may include, for example, propagation delays $t_p$ through the circuit primitive and average power dissipation $P_{avg}$ of the circuit primitive.

Table 1 provides an example of circuit primitives which may be simulated. These are NAND, NOR, inverter, and NAND CPL gates. As shown in the table, these simulated circuit primitives are comprised of NMOS and/or PMOS transistors. The circuit performance variable simulated for these circuit primitives was $t_p$ and $P_{avg}$. To this end, five-stage ring oscillators were simulated for NAND, NOR, and inverter gates with a fanout of two identical gates per stage. For evaluating the NAND CPL, a buffered NAND gate was simulated and $t_p$ was calculated from the average of its $t_{pLH}$ and $t_{pHL}$.

The results of the simulations for the NAND, NOR, inverter, and NAND CPL gates are presented in FIGS. 2A and 2B. These figures show the high degree of correlation amongst these primitives with regard to both $t_p$ and $P_{avg}$. The figures show that there are no dies which produced the traditional ±3 sigma levels of worst and best case circuit variables. This is expected for a random sampling of 40 dies since the probability of dies occurring at the ±3 sigma points and beyond is, on the average, three observations per every 1000 samples. The highest and lowest values for $t_p$ will represent the worst and best cases files, respectively. Similar considerations also hold for $P_{avg}$.

With the user interface 218, the user then uses the worst, best, and nominal case model parameter selector 224 to select the sets of measurements 214 which provide the worst, best, and nominal cases for each performance parameter (block 704 of FIG. 7). The selector 224 is stored in the primary memory 221 and run on the CPU 222.

As both FIGS. 2A and 2B show, multiple dies exist for worst, best, and nominal $t_p$, as well as for nominal $P_{avg}$. These die numbers are listed in Table 2 with some of their (normalized) BSIM3 NMOS parameters. As Table 2 illustrates, the worst case sigma level of a circuit performance parameter is not associated with the sigma level of the corresponding device parameters. Furthermore, more than one combination of device parameters can yield identical circuit performance. This invalidates the assumptions of the "corners" methodology previously mentioned.

One way in which the selector 224 may generate worst, best, and nominal case parameter sets from among multiple worst, best, and nominal case parameter sets 214 (for the corresponding dies) resulting in the same performance level is to average the measured parameters for these sets. However, as FIG. 3 shows, the results of this averaging scheme does not match the actual (extracted) worst-case and nominal $t_p$ values. Averaging worst-case parameter sets yielded a value of +2.0 sigma, half a sigma less than the actual worst-case value. Similarly, averaging nominal parameter sets produced a value of approximately −0.5 sigma.

In order to provide a more realistic solution to resolve multiple worst, best, and nominal case parameter sets, model selector 224 may use a secondary performance parameter as a "tie-breaker" to a primary performance parameter. For example, Table 2 shows that the measured parameter sets for both dies 15 and 21 give a worst-case $t_p$ (primary performance parameter) at approximately +2.5 sigma level for all the primitives. However, referring to FIG. 4, the measured parameter set for die 15 results in a higher $P_{avg}$ (secondary performance parameter) value than die 21 and will therefore represent the worst-case file for $t_p$. Die 15 is worse than die 21 because it not only has equally slow $t_p$ but more $P_{avg}$ as well. Further application of this procedure produces die number 10 as the best-case for $t_p$.

The usefulness of this method for resolving multiple worst, best, and nominal case parameter sets is further illustrated for determining the nominal parameter sets for $t_p$ and $P_{avg}$. From Table 2 there are six nominal parameter sets for $t_p$ and five for $P_{avg}$. Referring to FIGS. 4 and 5, to resolve so many multiple nominal files, both first and secondary performance parameters are to be as close as possible to the nominal. The results of multiple file resolution are given in FIG. 4 for $t_p$ and FIG. 5 for $P_{avg}$.

Referring back to FIG. 6, the selector 224 then takes (or extracts) from the secondary memory 212 the determined (or resolved) worst, best, and nominal case parameter sets 226 for each performance parameter and stores them in the primary memory 221. These parameter sets are then the worst, best, and nominal model parameter sets to be used in circuit simulation of a full target circuit that uses the type of circuit components for which these parameter sets were measured.

With the user interface 218, the user then generates target circuit simulation files 228 for the target circuit for each performance parameter. Thus, each file contains a netlist for the circuit components of the type for which the parameter sets were measured and one of the worst, best, and nominal case parameter sets 226.

With the user interface 218, the user then simulates the performance of the target circuit using the circuit simulator 220 and the generated target circuit simulation files 228 (block 706 of FIG. 7). The performance results of the simulations are then stored in the primary memory 221. These performance results include the worst, best, and nominal case performances for each of the performance parameters described earlier.

tion. Various modifications may occur to those skilled in the art without departing from the true spirit and scope of the invention as defined by the appended claims.

TABLE 1

| Building Block | Transistors sizes used in primitives | | Notes |
|---|---|---|---|
| | W/L (NMOS). | W/L (PMOS) | |
| NAND | 3.2/0.8 | 4.0/0.8 | 5 stage ring oscillator, Fanout = 2 |
| NOR | 3.2/0.8 | 16/0.8 | 5 stage ring oscillator, Fanout = 2 |
| Inverter | 7.2/0.9 | 18/0.9 | 5 stage ring oscillator, Fanout = 2 |
| NAND CPL (buffered output) | 1.6/0.8 | | Inverter buffer sizes: (W/L)n = 1.6/0.8 (W/L)p = 2.4/0.8 |

TABLE 2

Normalized device parameter values for multiple SPICE files

| File | Sigma Level | Die Number | Tox (σ) | Vth (σ) | dl (σ) | dw (σ) | K1$^a$ (σ) | K2$^b$ (σ) | Rds0 (σ) |
|---|---|---|---|---|---|---|---|---|---|
| Best-Case $\tau_p$ | −1.5 | 18 | 1.35 | 1.15 | 2.16 | 1.48 | 1.21 | −0.85 | −0.32 |
| | −1.5 | 10 | 1.23 | 0.40 | 0.57 | 0.92 | 0.37 | −0.19 | −0.29 |
| Worst-Case $\tau_p$ | +2.5 | 15 | −1.13 | 0.27 | −1.30 | −1.00 | −0.82 | 0.53 | −1.32 |
| | +2.5 | 21 | 0.03 | 0.76 | −2.13 | 1.57 | 0.68 | −1.17 | −0.81 |
| Nominal $\tau_p$ | 0 | 1 | 0.74 | 0.65 | −0.38 | −1.42 | 0.42 | −0.14 | 0.29 |
| | 0 | 3 | −1.02 | −1.62 | 0.17 | −0.70 | −0.77 | 0.30 | 0.08 |
| | 0 | 14 | −0.67 | 1.26 | 0.72 | 0.14 | −0.44 | 0.46 | −1.11 |
| | 0 | 19 | 1.59 | 1.61 | −0.75 | −0.02 | 1.40 | −0.98 | −0.81 |
| | 0 | 23 | −1.02 | −0.10 | 0.40 | −1.43 | −0.29 | −0.21 | −0.80 |
| | 0 | 24 | −1.36 | −1.31 | 0.20 | −1.00 | −1.27 | 0.68 | −0.63 |
| Nominal $P_{avg}$ | 0 | 4 | 1.23 | 1.11 | −0.45 | 0.48 | −2.60 | 3.67 | 0.07 |
| | 0 | 11 | 1.11 | 0.35 | −1.17 | 0.14 | −0.74 | 1.15 | −0.99 |
| | 0 | 14 | −0.67 | 1.26 | 0.72 | 0.14 | −0.44 | 0.46 | −1.11 |
| | 0 | 28 | 0.27 | 0.00 | 0.00 | −0.25 | −0.20 | 0.53 | −0.62 |
| | 0 | 30 | −0.79 | 1.88 | 0.20 | −0.01 | 0.36 | −0.11 | −0.44 |

$^a$First-order body effect coefficient
$^b$Second-order body effect coefficient Thus, the present invention provides a methodology for realistic worst, best, and nominal circuit simulation file generation. Actual extracted device parameter sets are used to analyze the basic building blocks, or primitives, of a circuit design. This methodology generates more realistic worst case, best case and nominal simulations than the conventional "corners" methodology. Furthermore, the use of secondary performance parameters to discern between multiple files yields particularly more realistic results.

For purposes of demonstrating the present invention, the invention has been applied to digital logic circuits with primitives chosen to be NAND, NOR, inverter, and NAND CPL gates comprised of NMOS and/or PMOS transistors. However, those skilled in the art will recognize that other types of digital circuit primitives may be chosen which are comprised of other circuit elements for which parameter measurements may be made. Moreover, the invention may be applied to analog circuits for which various types of analog circuit primitives may be chosen. Thus, while the present invention has been described with reference to a few specific embodiments, the description is illustrative of the invention and is not to be construed as limiting the inven-

What is claimed is:

1. A method of generating sets of model physical parameter values for physical parameters of circuit components for use in simulating operation of a circuit that includes the circuit components, the method comprising the steps of:
   for each of various dies of a wafer that each have the circuit components fabricated thereon, measuring physical parameter values at the die for the physical parameters of the circuit components so as to generate a set of measured physical parameter values for the die;
   for each of the various dies, simulating performance of circuit primitives formed by the circuit components using the set of measured physical parameter values for the die so as to generate for the die a set of simulated performance parameter values for predefined performance parameters of the circuit primitives; and
   generating the sets of model physical parameter values from the sets of measured physical parameter values for the various dies based on the sets of simulated performance parameter values for the various dies.

2. The method of claim 1 wherein:
   there are multiple performance cases for each of the predefined performance parameters; and the sets of model physical parameter values comprise a set of model physical parameter values for each of the performance cases for each of the predefined performance parameters.

3. The method of claim 2 wherein:

the set of simulated performance parameter values for each of the various dies comprises performance parameter values for each of the predefined performance parameters; and when there are multiple dies of the various dies whose sets of simulated performance parameter values have approximately equal performance parameter values for a specific case of the performance cases of a specific parameter of the predefined performance parameters, the generating step includes extracting the set of model physical parameter values for the specific case of the specific parameter from the sets of measured physical parameter values for the multiple dies by selecting the set of measured physical parameter values for a particular die of the multiple dies based on the performance parameter values of the set of simulated performance parameter values for the particular die that are for another parameter of the predefined performance parameters.

4. The method of claim 2 wherein:

the set of simulated performance parameter values for each of the dies comprises performance parameter values for each of the predefined performance parameters; and when the sets of simulated performance parameter values for multiple dies of the various dies have approximately equal performance parameter values for a specific case of the performance cases of a specific parameter of the predefined performance parameters, the generating step includes extracting the set of model physical parameter values for the specific case of the specific parameter from the sets of measured physical parameter values for the multiple dies by averaging the sets of measured physical parameter values for the multiple dies.

5. A system of generating sets of model physical parameter values of physical parameters of circuit components for use in simulating operation of a circuit that includes the circuit components, the system comprising:

a metrology subsystem that, for each of various dies of a wafer that each have the circuit components fabricated thereon, measures physical parameter values at the die for the physical parameters of the circuit components so as to generate a set of measured physical parameter values for the die;

a circuit simulator that, for each of the dies, simulates performance of circuit primitives formed by the circuit components using the set of measured physical parameter values for the die so as to generate for the die a set of simulated performance parameter values for predefined performance parameters of the circuit primitives; and a model parameter selector that generates the model sets of physical parameter values from the sets of measured physical parameter values for the various dies based on the sets of simulated performance parameter values for the various dies.

6. The system of claim 5 wherein:

there are multiple performance cases for each of the predefined performance parameters; and the sets of model physical parameter values comprise a set of model physical parameter values for each of the performance cases for each of the predefined performance parameters.

7. The system of claim 6 wherein:

the set of simulated performance parameter values for each of the various dies comprises performance parameter values for each of the predefined performance parameters; and when there are multiple dies of the various dies whose sets of simulated performance parameter values have approximately equal performance parameter values for a specific case of the performance cases of a specific parameter of the predefined performance parameters, the model parameter selector extracts the set of model physical parameter values for the specific case of the specific parameter from the sets of measured physical parameter values for the multiple dies by selecting the set of measured physical parameter values for a particular die of the multiple dies based on the performance parameter values of the set of simulated performance parameter values for the particular die that are for another parameter of the predefined performance parameters.

8. The system of claim 6 wherein:

the set of simulated performance parameter values for each of the dies comprises performance parameter values for each of the predefined performance parameters; and when the sets of simulated performance parameter values for multiple dies of the various dies have approximately equal performance parameter values for a specific case of the performance cases of a specific parameter of the predefined performance parameters, the model parameter selector extracts the set of model physical parameter values for the specific case of the specific parameter from the sets of measured physical parameter values for the multiple dies by averaging the sets of measured physical parameter values for the multiple dies.

9. A computer readable memory for use in generating files of model physical parameter values of physical parameters of circuit components for use in simulating operation of a circuit that includes the circuit components, the computer readable memory being used with files of measured physical parameter values for various dies of a wafer that each have the circuit components fabricated thereon, the files of measured physical parameter values including, for each of the various dies, a file of measured physical parameter values that are measured at the die for the physical parameters of the circuit components, the computer readable memory comprising:

a circuit simulator that, for each of the various dies, simulates performance of circuit primitives formed by the circuit components using the file of measured physical parameter values for the die so as to generate for the die a file of simulated performance parameter values for predefined performance parameters of the circuit primitives; and a model parameter selector that generates the files of model physical parameter values from the files of measured physical parameter values for the various dies based on the files of simulated performance parameter values for the various dies.

10. The computer readable memory of claim 9 wherein:

there are multiple performance cases for each of the predefined performance parameters; and the files of model physical parameter values comprise a file of model physical parameter values for each of the performance cases for each of the predefined performance parameters.

11. The computer readable memory of claim 10 wherein:

the file of simulated performance parameter values for each of the various dies comprises performance parameter values for each of the predefined performance parameters; and when there are multiple dies of the various dies whose files of simulated performance parameter values have approximately equal performance parameter values for a specific case of the performance cases of a specific parameter of the predefined performance parameters, the model parameter selector extracts the file of model physical parameter values for the specific case of the specific parameter from the files of measured physical parameter values for the multiple dies by selecting the file of measured physical parameter values for a particular die of the multiple dies based on the performance parameter values of the file of simulated performance parameter values for the particular die that are for another parameter of the predefined performance parameters.

12. The computer readable memory of claim 10 wherein:

the file of simulated performance parameter values for each of the dies comprises performance parameter values for each of the predefined performance parameters; and when the files of simulated performance parameter values for multiple dies of the various dies have approximately equal performance parameter values for a specific case of the performance cases of a specific parameter of the predefined performance parameters, the model parameter selector extracts the file of model physical parameter values for the specific case of the specific parameter from the files of measured physical parameter values for the multiple dies by averaging the files of measured physical parameter values for the multiple dies.

13. A computer readable memory for use in simulating operation of a circuit that includes circuit components, the computer readable memory comprising:

files of model physical parameter values for physical parameter values of the circuit components, the files of model physical parameter values being generated by:

for each of various dies of a wafer that each have the circuit components fabricated thereon, measuring physical parameter values at the die for the physical parameters of the circuit components so as to generate a file of measured physical parameter values for the die;

for each of the various dies, simulating performance of circuit primitives formed by the circuit components using the file of measured physical parameter values for the die so as to generate for the die a file of simulated performance parameter values for predefined performance parameters of the circuit primitives; and generating the files of model physical parameter values from the files of measured physical parameter values for the various dies based on the files of performance parameter values for the various dies; and a circuit simulator that uses the files of model physical parameter values to simulate operation of the circuit.

14. The computer readable memory of claim 13 wherein:

there are multiple performance cases for each of the predefined performance parameters; and the files of model physical parameter values comprise a file of model physical parameter values for each of the performance cases for each of the predefined performance parameters.

15. The computer readable memory of claim 14 wherein:

the file of simulated performance parameter values for each of the various dies comprises performance parameter values for each of the predefined performance parameters; and when there are multiple dies of the various dies whose files of simulated performance parameter values have approximately equal performance parameter values for a specific case of the performance cases of a specific parameter of the predefined performance parameters, the file of model physical parameter values for the specific case of the specific parameter is generated from the files of measured physical parameter values for the multiple dies by selecting the file of measured physical parameter values for a particular die of the multiple dies based on the performance parameter values of the file of simulated performance parameter values for the particular die that are for another parameter of the predefined performance parameters.

16. The computer readable memory of claim 14 wherein:

the file of simulated performance parameter values for each of the dies comprises performance parameter values for each of the predefined performance parameters; and when the files of simulated performance parameter values for multiple dies of the various dies have approximately equal performance parameter values for a specific case of the performance cases of a specific parameter of the predefined performance parameters, the file of model physical parameter values for the specific case of the specific parameter is generated from the files of measured physical parameter values for the multiple dies by averaging the files of measured physical parameter values for the multiple dies.

17. A method of generating model sets of physical parameter values of physical parameters of circuit components for use in simulating operation of a circuit that includes the circuit components, the method being used with measured sets of physical parameter values for various dies of a wafer that each have the circuit components fabricated thereon, the sets of measured physical parameter values including, for each of the various dies, a file of measured physical parameter values that are measured at the die for the physical parameters of the circuit components, the computer readable memory comprising:

for each of the various dies, simulating performance of circuit primitives formed by the circuit components using the set of measured physical parameter values for the die so as to generate for the die a set of simulated performance parameter values for predefined performance parameters of the circuit primitives; and generating the sets of model physical parameter values from the sets of measured physical parameter values for the various dies based on the sets of generated performance parameter values for the various dies.

18. The method of claim 17 wherein:

there are multiple performance cases for each of the predefined performance parameters; and the sets of model physical parameter values comprise a set of model physical parameter values for each of the performance cases for each of the predefined performance parameters.

19. The method of claim 18 wherein:

the set of simulated performance parameter values for each of the various dies comprises performance parameter values for each of the predefined performance parameters; and when there are multiple dies of the various dies whose sets of simulated performance parameter values have approximately equal performance parameter values for a specific case of the performance cases of a specific parameter of the predefined performance parameters, the generating step includes extracting the set of model physical parameter values for the specific case of the specific parameter from the sets of measured physical parameter values for the multiple dies by selecting the set of measured physical parameter values for a particular die of the multiple dies based on the performance parameter values of the set of simulated performance parameter values for the particular die that are for another parameter of the predefined performance parameters.

20. The method of claim 18 wherein:

the set of simulated performance parameter values for each of the dies comprises performance parameter values for each of the predefined performance parameters; and when the sets of simulated performance parameter values for multiple dies of the various dies have approximately equal performance parameter values for a specific case of the performance cases of a specific parameter of the predefined performance parameters, the generating step includes extracting the set of model physical parameter values for the specific case of the specific parameter from the sets of measured physical parameter values for the multiple dies by averaging the sets of measured physical parameter values for the multiple dies.

* * * * *